(12) United States Patent
Ruello et al.

(10) Patent No.: US 6,475,620 B1
(45) Date of Patent: Nov. 5, 2002

(54) METHOD FOR DEPOSITING A COATING LAYER ON AN OPTICAL FIBER WHILE IT IS BEING DRAWN AND DEVICE FOR ITS IMPLEMENTATION

(75) Inventors: Yves Ruello, Lannion (FR); Benoit Cadier, Ploumanach (FR)

(73) Assignee: France Telecom (SA), Paris (FR)

( * ) Notice: Subject to any disclaimer, the term of this patent is extended or adjusted under 35 U.S.C. 154(b) by 0 days.

(21) Appl. No.: 09/423,826
(22) PCT Filed: May 12, 1998
(86) PCT No.: PCT/FR98/00949
§ 371 (c)(1),
(2), (4) Date: Feb. 4, 2000
(87) PCT Pub. No.: WO98/51632
PCT Pub. Date: Nov. 19, 1998

(30) Foreign Application Priority Data

May 14, 1997 (FR) .............................. 97 05893

(51) Int. Cl.[7] .............................. B05D 5/06; H05H 1/30; D02G 3/00
(52) U.S. Cl. .................... 428/392; 428/375; 427/162; 427/163.2; 427/166; 427/573; 427/575
(58) Field of Search .............................. 427/162, 163.1, 427/163.2, 164, 165, 166, 553, 573, 575, 255.5; 428/375, 392; 385/126

(56) References Cited

U.S. PATENT DOCUMENTS 4,118,211 A 10/1978 Au Coin et al. .................. 65/3

FOREIGN PATENT DOCUMENTS

| EP | 0 222 960 | 5/1987 |
| FR | WO96/06054 | 2/1996 |
| JP | 61 046915 | 3/1986 |

OTHER PUBLICATIONS

Database WPI, XP002055678 & JP 01 062 471, Fujitsu Ltd., Mar. 1989.
Databas WPI, XP002055679 & JP 56 097 303, Fujikura Cabe Works, Aug. 1981.

*Primary Examiner*—Cynthia H. Kelly
*Assistant Examiner*—J. M. Gray
(74) *Attorney, Agent, or Firm*—Nilles & Nilles S.C.

(57) ABSTRACT

A method for the deposition of a coating layer on an optical fiber while it is being drawn. The coating layer is designed to reduce the permeability of the optical fiber to water vapor and therefore to increase its lifetime. The method is characterized in that it consists in carrying out a decomposition of a gas mixture of boron halogenide and hydrogen and/or boron halogenide and ammonia gas by a microwave plasma-assisted addition of energy and in that the operation is conducted in the presence of a carrier gas in order firstly to carry the gas mixture to a reaction medium and secondly to activate the plasma.

19 Claims, 3 Drawing Sheets

METHOD FOR DEPOSITING A COATING LAYER ON AN OPTICAL FIBER WHILE IT IS BEING DRAWN AND DEVICE FOR ITS IMPLEMENTATION

BACKGROUND OF THE INVENTION

The present invention relates to a method for the deposition of a coating layer on an optical fiber while it is being drawn. This coating layer is designed to improve the imperviousness and lifetime of the optical fiber.

At present, optical fibers are widely used in long-distance transmission networks. They are also designed to convey information up to the home of a residential user. These fibers, made of silica, are nevertheless sensitive to ambient humidity which greatly weakens their fatigue strength and therefore reduces their lifetime.

One problem therefore lies in finding a solution for the low-cost protection of optical fibers against ambient humidity without causing deterioration in their mechanical strength. For this purpose, several types of so-called hermetically sealing coatings, with very low permeability to water vapor, have been designed and developed.

These hermetically sealing coatings make it possible to increase the fatigue strength of the fibers and therefore increase their lifetime.

The following relationship expresses the lifetime of a fiber as a function of the critical stress sc of the stress applied sa, and of a factor n expressing the permeability of the fiber:

$$tf = B^* \, sc^{n-2}/sa^n; \text{ and } B \text{ is a constant.}$$

After measuring the lifetime tf, namely the rupture time as a function of the different stresses applied, the value n can be deduced by plotting the curve ln tf=f(ln sa).

It can be seen that the lower the permeability of the fiber to water vapor, the higher is the factor n and therefore the greater is the lifetime tf.

The various hermetically sealing coatings that have been studied up to now are made of ceramic, metal, carbon and hydrophobic polymer type materials.

The ceramics are for example silicon carbide, titanium carbide or silicon nitride. Their deposition on optical fibers is done according to the well-known technique of chemical vapor phase deposition (CVD). In this case, the speed of deposition associated with this process is in the range of 60 nm/min, which is far too small to be compatible with a dynamic fiber-drawing method in which the running speed of an optical fiber is generally greater than 20 m/min. Furthermore, the deposition of this type of coating is necessarily done on substrates heated to a temperature greater than or equal to 900° C.

Metal coatings such as aluminum, zinc or tinplate for example are obtained by a method known as the "freezing" method in which a molten metal fiber is impregnated. In no circumstance can this type of method be used during a fiber-drawing operation. For, the deposition speed is greatly limited by the cooling of the molten metal and is therefore not compatible with the fiber-drawing speed. The fibers coated with such coatings are used only for specific applications such as the manufacture of sensors or fibers for components for example, or they are used for their resistance to high temperatures in the case of metals such as aluminum, copper or gold for example. Furthermore, these metal coatings are necessarily deposited on substrates heated to temperatures greater than or equal to 900° C.

The deposition of carbon has also been considered. This deposition uses "diamond" type carbon and "graphite" type carbon. This deposition is done according to the standard technique of chemical vapor deposition (CVD), under atmospheric pressure, on fibers placed in a reactor. The fibers obtained generally have high fatigue strength with a factor n of about 100, but their mechanical strength thereby deteriorates. Furthermore, the reagents used, which are of the hydrocarbon type, are present in large quantities and clog the walls of the reactor. Owing to this pollution, high quality deposits can be made only on very small fiber lengths and recycling procedures have to be frequently performed. Consequently, the cost of the fibers is considerably increased.

'Diamond' type carbon is deposited on a fiber heated to 200° C. or more. However, at this temperature, it is deposited simultaneously on the walls of the reactor. To prevent clogging of this kind, it is necessary to cool the walls of the reactor significantly with respect to the fiber. Now a cooling of this kind is very difficult to achieve at temperatures below 200° C.

Finally, coatings of hydrophobic polymers have been designed. The deposition is performed identically to a standard deposition. However, the imperviousness of this type of coating diminishes constantly after exposure to humidity and it loses its hydrophobic properties after a few years.

OBJECTS AND SUMMARY OF THE INVENTION

The present invention makes it possible to mitigate the above-mentioned drawbacks since it proposes a low cost method that can be used to deposit a hermetically sealing coating on an optical fiber at very high speed, compatible with the fiber-drawing method, without causing deterioration in the mechanical properties of the fiber.

It pertains more particularly to a method for the deposition of a coating layer on an optical fiber while it is being drawn, this coating layer being designed to improve the imperviousness and lifetime of the optical fiber, characterized in that the method consists in carrying out a decomposition of a gas mixture of boron halogenide and hydrogen and/or boron halogenide and ammonia gas by means of a microwave plasma-assisted addition of energy, and in that the operation is conducted in the presence of a carrier gas in order firstly to carry the gas mixture towards a reaction medium and secondly to activate the plasma.

Boron is next to carbon in the periodic table of elements and therefore has properties similar to those of carbon. Thus, it has a highly covalent type of chemistry. Furthermore, its electron structure explains its small atomic radius, its high density and its very great hardness. It also has a low expansion coefficient and a high softening point. Boron nitride for its part is also very hard and is generally used to improve the abrasion strength and resistance to wear and tear of certain objects.

The obtaining of boron by the reduction of boron halogenides such as chlorides and bromides under hydrogen is well known as the Van Arkel reaction. Similarly, boron nitride is obtained by the reduction of boron halogenide in the presence of ammonia gas. In general, the energy needed for the chemical reaction is provided either by heating during an operation of chemical vapor deposition (CVD) or by plasma-assisted heating during an operation of plasma-assisted chemical vapor deposition (PAVCD).

It appears furthermore that boron bromide is a valuable reagent as it enables deposits to be made on substrates heated to temperatures starting from 400° C. which are low enough to prevent the clogging of the walls of the reactor.

The carrier gas for its part is used to carry the gas mixture into a reaction chamber and activate the plasma. The presence of this carrier gas consequently enables an increase in the reaction speed of decomposition of boron halogenide and therefore an increase in the speed of deposition of boron and/or boron nitride on the fiber.

Through the method according to the invention, the speed of deposition is high, in the range of 300 to 500 µm/h, and compatible with the drawing speed of an optical fiber. The coating layer obtained increases the fatigue strength of the fiber, the factor n being greater than or equal to 100, without lowering its mechanical strength. The method according to the invention is furthermore a low-cost method.

Another object of the invention relates to a device for the implementation of this method. This device comprises:

- a tubular reaction chamber comprising, at each of its ends respectively, an inlet lock and an outlet lock enabling the continuous passage of the optical fiber within the chamber,
- a cooling system used to maintain the wall of the reaction chamber at a constant temperature equal to or below 100° C.,
- a pumping set connected firstly to the reaction chamber to trap the residual gases and maintain a constant pressure and, secondly, to the inlet and outlet locks to maintain a pressure close to or identical to the pressure prevailing inside the reaction chamber,
- a gas unit connected to the inlet lock and/or to the reaction chamber, and
- means for the production of microwave plasma-assisted heating.

Other special features and advantages of the invention shall appear from the following detailed description given by way of a non-restrictive illustration with reference to the appended drawings, of which:

DESCRIPTION OF THE PREFERRED EMBODIMENTS

Figure 1:
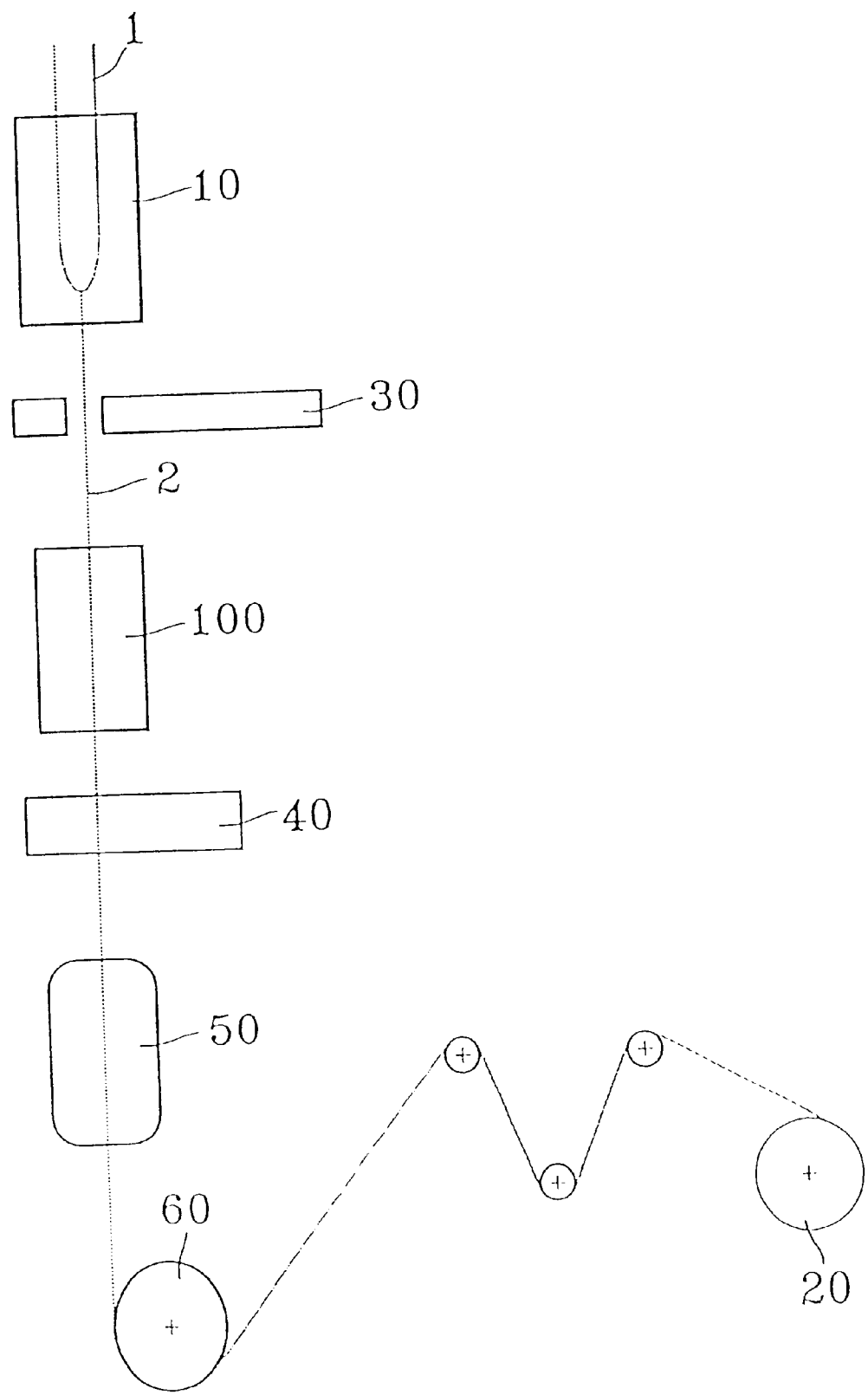
FIG. 1 shows a drawing of a standard fiber-drawing tower in which a device for the implementation of the method according to the invention has been inserted.

The fiber-drawing operation consists of the conversion of a preform into fiber. In FIG. 1, the preform is referenced 1 and the fiber is referenced 2. The preform 1 is heated in a high frequency oven 10 to a temperature such that it can be drawn. In general, this temperature is greater than or equal to 2400° C. The molten silica is then drawn so as to form a fiber 2.

The fiber 2 coming from the fiber-drawing oven should have constant and well-defined dimensions. These dimensions in particular are a function of the fiber-drawing temperature and the tensile force applied to the fiber. A machine 30 therefore is used to measure the diameter of the fiber 2. This measurement of the diameter furthermore enables the feedback control of the speed of a drum 20 on which the fiber 2 gets wound.

However, a fiber 2 of this kind is brittle, and any slight damage created on its surface could considerably harm the mechanical strength of this surface. This is why it is important that the fiber 2 should be covered with a protective coating resistant to the abrasion that may be caused especially by the drum 20. This protective coating is deposited on the fiber, at the outlet of the fiber-drawing oven, the fiber 2 being made to go into a container 40 containing a liquid plastic. The plastic coating the fiber is then solidified either under the action of heat, in a polymerizing oven 50, or under the action of ultraviolet rays. The plastic may be a silicone-based resin, polyvinylidene fluoride, polytetrafluoroethylene or polyimide or methane polyacrylate. The coating and the fiber must be strictly concentric. The fiber 2 is then transferred to a capstan 60 which enables the fiber-drawing speed to be regulated, and it is then wound on the drum 20.

The plastic coating used to protect the fiber 2 against abrasion is however not impermeable to water vapor: the factor n is low, in the range of 20 to 30. Consequently, to enable an improvement in the imperviousness of the fiber to water vapor, a second coating has to be deposited on the fiber. Preferably, this hermetically sealing coating is deposited directly on the fiber at its exit from the fiber-drawing oven and before the deposition of the abrasion-resistant coating.

The device used to carry out the deposition of the hermetically sealing coating is therefore placed at the exit from the fiber-drawing oven 10 and before the container 40 of liquid plastic. This device is referenced 100 in FIG. 1.

Figure 2:
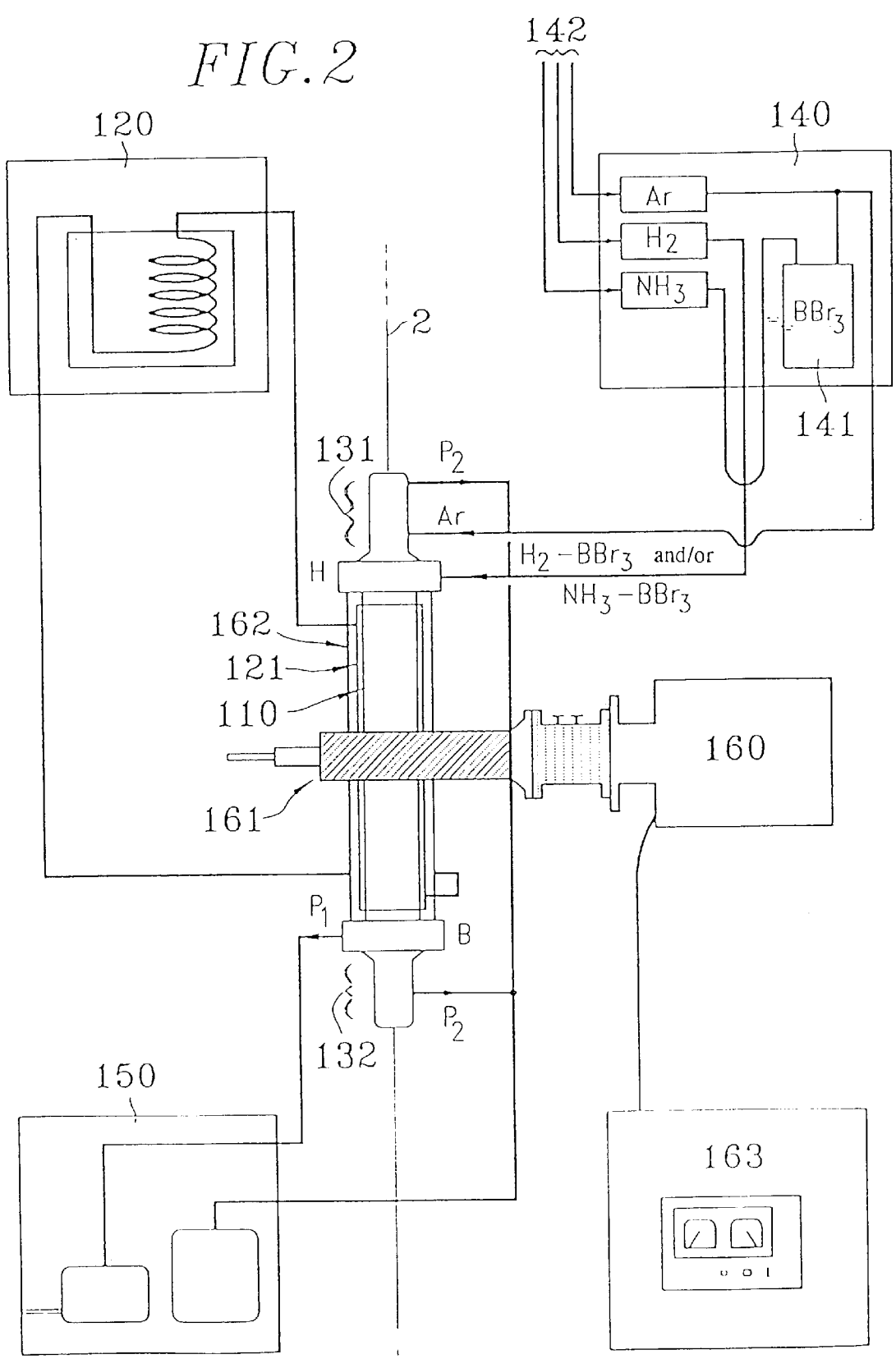
FIG. 2 shows a drawing of the device according to the invention.

The method according to the invention and the device to implement it will be understood more clearly with reference to FIG. 2 which provides a schematic drawing of an embodiment of the device according to the invention.

The method according to the invention consists of the deposition of a coating containing boron and/or boron nitride on a fiber running at high speed. The fiber-drawing speed is generally greater than 20 m/min and may reach values in the range of 500 m/min.

Hereinafter in the description, the fiber 2, also known as a substrate, is made of silica and has a diameter of 125 µm. Naturally, this is only an example and, in an alternative embodiment, this substrate, made of silica, may also take the form of a tube or any other profile with a cross-section of some mm².

A preferred mode of carrying out the method of deposition according to the invention consists in effecting the decomposition of a gas mixture of boron halogenide and hydrogen and/or boron halogenide and ammonia gas by means of a microwave plasma-assisted addition of reaction energy. The reaction energy is provided for example in thermal form. Preferably, the boron halogenide is boron tribromide. This reagent is indeed valuable because it enables the deposition of boron or boron nitride on a fiber heated to a relatively low temperature, equal to or greater than 400° C.

Furthermore, a carrier gas that is inert with respect to the reaction medium is advantageously used to carry the gas mixture towards the reaction medium as well as to activate the plasma. Through the presence of this carrier gas, the reaction speed of decomposition of the boron halogenide considerably increases. Consequently, the speed of deposition of the boron and/or boron nitride is far higher than it is in the absence of this carrier gas. This gas may for example be nitrogen or argon. Argon is preferably used because it enables a greater activation of plasma and therefore greater efficiency in the reaction of decomposition of boron tribromide.

The reactions of decomposition of boron tribromide in the presence of hydrogen or ammonia gas are written as follows:

$$2\ BBr_3 + 3H_2 \quad BBr_3 + NH_3$$

In both cases, hydrogen and ammonia gas are preferably in excess with respect to halogenide so as to be sure of obtaining a total decomposition of boron tribromide.

The device according to the invention placed on the fiber-drawing line, at the exit from the fiber-drawing oven, comprises: a reaction chamber 110, a cooling system 120, a pumping set 150, a gas unit 140 and means 160, 161, 162, 163 designed for the production of microwave plasma-assisted heating.

The boron and/or boron nitride must be deposited at very high speed on the fiber running through the reaction medium. Owing to the filar configuration of the substrate, and to maintain a deposition quality compatible with high fiber-drawing speeds, it has been necessary to try and extend the plasma zone along the axis of movement of the fiber 2.

For this purpose, the reaction chamber 110 advantageously takes a tubular form. It is preferably made of quartz. It has an internal diameter of about 20 mm and a length of about one meter for example. Naturally, the dimensions of the reaction chamber are not limited to these values. Their height may vary. The reaction chamber 110 is furthermore positioned symmetrically on either side of a coupler designed to sustain the plasma.

A cooling system 120 is furthermore advantageously designed to maintain the wall of the reaction chamber at a constant temperature of less than 100° C. For this purpose, the reaction chamber 110 has a double wall 121 within which a dielectric oil, which is a silicone-based oil for example, is injected from the cooling system 120. This oil has a constant temperature of about 5° C. and flows in a closed circuit. It is injected into the double wall 121, at the lower end B of the reaction chamber, and emerges from the upper end H of the reaction chamber.

The double wall 121 is advantageously formed by a second quartz tube whose internal diameter ranges for example from 29 mm to 35 mm.

Through this cooling system, it is possible to keep the reaction chamber at a temperature close to 100° C. or less, thus making it possible to prevent any risk of clogging by the deposition of reagents on this wall.

Furthermore, the reaction chamber 110, at each of its ends, respectively has an inlet lock 131 and an outlet lock 132. The inlet lock 131 is located at the top end H of the reaction chamber and the outlet lock 132 is located at the bottom end B of the reaction chamber. These two locks are designed so as to enable the continuous passage of the optical fiber 2 within the reaction chamber 110. They are described in greater detail in the description made with reference to FIG. 3.

A gas unit 140 is furthermore connected to the inlet lock 131 and/or the reaction chamber 110 to enable the injection firstly of the carrier gas and secondly of the gas mixture of boron tribromide and hydrogen and/or boron tribromide and ammonia gas.

The gases are preferably stored in bottles placed in a cubicle outside the buildings. They are conveyed to the unit 140 through conduits 142.

The gas unit is preferably provided with a thermostat control system so as to prevent possible condensation phenomena and keep the gases at a constant temperature of about 40° C. Furthermore, the boron tribromide is advantageously contained in a bubbling chamber 141 whose temperature is also maintained at about 40° C.

The unit 140 furthermore enables the creation of the gas mixture of boron tribromide and hydrogen and/or boron tribromide and ammonia gas. For this purpose, a set of flow-meters, referenced $H_2$ and $NH_3$ in FIG. 2, is used to control the flow rate of hydrogen and/or ammonia gas passing through the bubbling chamber 141 to carry the boron tribromide. Similarly, a flow-meter referenced Ar is reserved to control the flow rate of the carrier gas. The quantity of boron tribromide carried depends not only on the temperature of the bubbling chamber 141 but also on the flow rate of the hydrogen, ammonia and argon gases used.

Preferably, the hydrogen and/or ammonia gas is in excess with respect to the boron tribromide so as to ensure the total decomposition of the boron halogenide. Furthermore, the presence of the carrier gas used to carry the gas mixture and activate the plasma makes it possible to use small quantities of reagents. Thus, the ratio by volume of hydrogen to boron tribromide ($H_2/BBr_3$) and/or the ratio by volume of ammonia gas to boron tribromide ($NH_3/BBr_3$) is smaller than 50. Preferably, it ranges from 15 to 40.

The flow rate of hydrogen and/or ammonia gas preferably ranges from 200 to 1000 $cm^3$/min and the carrier gas, argon, flows with a flow rate of 10 to 100 $cm^3$/min.

Furthermore, the carrier gas flowing in the reaction medium is located in the vicinity of the optical fiber so that it enables an increase in the reactivity of the surface of the fiber. Consequently, the deposition of boron and/or boron nitride on the surface of the fiber is facilitated, and its quality is improved.

A pumping set 150 is furthermore connected to the inlet lock 131 and outlet lock 132 and to the reaction chamber 110. This pumping unit enables the performance of two types of pumping.

A first type of pumping operation P1 is performed at the lower end B of the reaction chamber 110 in order to maintain constant pressure in the chamber 110 and trap residual gases if any. This first type of pumping can be done by means of a dry pump for example. The small quantity of reagents used in association with the continuous suction P1 enables the elimination of the resulting problems related to pollution and recycling.

A secondary or differential pumping P2 is furthermore carried out in the inlet lock 131 and outlet lock 132. This differential pumping P2 enables the maintenance, in the inlet and outlet locks, of a level of pressure close to or identical to that prevailing inside the reaction chamber 110.

Plasma-assisted microwave chemical vapor deposition (PACVD) for its part is produced from a standard assembly comprising a coupler and an adapter 161, a metal guide 162 covering the reaction chamber 110 throughout its length, a magnetron 160 and a variable power microwave generator 163. Preferably, the microwave power used is greater than 500 watts.

Figure 3:
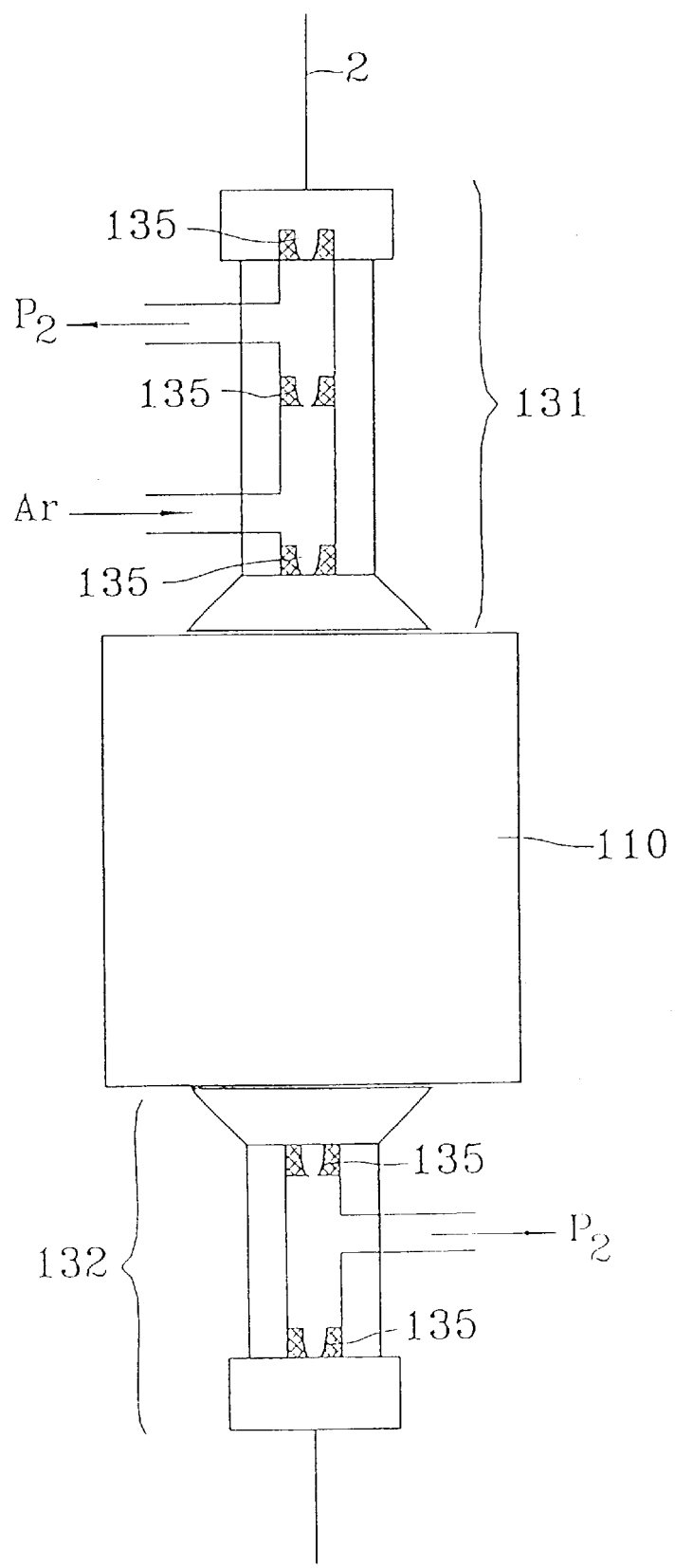
FIG. 3 shows a drawing of an inlet lock and an outlet lock located on either side of the reaction chamber of the device of FIG. 2.

FIG. 3 gives a more detailed schematic view of the inlet lock 131 and the outlet lock 132 located at the two ends of the reaction chamber 110. In this figure, the reaction chamber 110 is represented in a simplified schematic manner by a square but of course it actually has the same appearance as the one described with reference to FIG. 2.

The inlet lock 131 and the outlet lock 132 are designed to enable the passage at high speed of the optical fiber 2 from the exterior, where the pressure is the atmospheric pressure, to the interior of the reaction chamber 110 where the pressure is in the range of 1 millibar (1 mbar @ 100 Pa). The pressure within the two locks is therefore identical or close to the pressure prevailing inside the reaction chamber so as to prevent disturbances due to a sudden drop in pressure that might occur during the deposition. For this purpose, the secondary pumping P2 or differential pumping is performed in both the locks 131 and 132.

Furthermore, to eliminate any possible entry of oxygen that might slow down the deposition of boron and/or boron nitride and lower the quality of the coating layer, the carrier gas, argon, is advantageously introduced into the inlet lock 131 between the differential pumping P2 and the reaction chamber 110.

The gases $H_2$—$BBr_3$ or $NH_3$-$BBr_3$ are introduced either into the inlet lock with argon or directly into the reaction chamber at its top end H, as shown in FIG. 2.

The inlet lock 131 and the outlet lock 132 furthermore comprise lines 135. These lines 135 enable the passage of the optical fiber 2, flowing at high speed, without embrittling it for they make it possible to prevent all contact.

The inlet lock 131 has three lines 135 separated by two free spaces in which there are respectively performed the differential pumping P2 and the introduction of argon. The outlet lock 132 has two lines 135 separated by a free space in which the differential pumping P2 is performed.

Preferably, these lines 135 have a conical shape and, when the diameter of the optical fiber 2 is for example 125 $\mu$m, their diameter varies linearly from 300 to 700 $\mu$m. They are made of a ceramic or polymer type material such as polytetrafluoroethylene or polyamide or polyimide for example.

The three examples described hereinafter correspond to three series of different tests. They are given by way of an illustration but are no way restrictive.

The deposition of the hermetically sealing coating layer based on boron and/or boron nitride starts after the step for the drawing of the fiber 2, namely when the fiber 2 has a constant diameter, and it passes into the reaction chamber with a fiber-drawing speed that is constant and generally greater than 20 m/min. Prior to the deposition, a vacuum of less than $10^{-2}$ mbar (@ 1 Pa) is made in the reaction chamber.

The different operating conditions during the deposition depend on several parameters. In the example described hereinafter, in particular the gas flow rates used and the fiber-drawing speed are made to vary.

EXAMPLE 1
(Test Series No. 1)

This example corresponds to a first series of trials in which the gas flow rates and the fiber-drawing speed vary across a relatively small range of values.

| | |
|---|---|
| Length of the reaction chamber: | 800 mm |
| Temperature of $BBr_3$: | 40° C. |
| Temperature of the cooling unit: | 5° C. |
| Temperature of the substrate: | 500 to 850° C. |
| Microwave power: | 500 to 1000 watts |
| Fiber-drawing speed: | 80 m/min |
| Pressure: | 0.2 to 0.8 mbar |
| Pressure of Ar in the inlet lock: | 0.1 to 0.3 mbar |
| Flow rate of argon in the $BBr_3$ bubbling chamber: | 10 to 20 cm$^3$/min |
| Hydrogen flow rate: | 200 to 400 cm$^3$/min |

The coating layer was deposited on a thickness of 100 to 500 Angstroms (1 Angstrom=$10^{-10}$ meters) depending on the gas flow rates used and the pressure within the reaction chamber. This layer contains a major proportion of boron, namely a proportion of about 80 to 95%, and infimal quantities (less than 3%) of residues such as bromium. This example shows that it is possible to carry out the deposition of a hermetically sealing coat with relatively low gas flow rates. Since the argon makes it possible to carry the gas mixture $H_2$—$BBr_3$, the quantities of reagents used are smaller than they are when this carrier gas is absent.

Furthermore, the presence of argon enables the activation of the plasma and therefore an increase in the speed of decomposition of $BBr_3$. Consequently, the deposition speed is increased and made compatible with the fiber-drawing method. In this example, this speed of deposition is about 300 $\mu$m/h.

Furthermore, since the wall of the reaction chamber is cooled to a temperature below or equal to 100° C., any deposition of boron or boron nitride on this wall that would lead to a pollution of the reaction chamber is avoided.

There presently exist two methods currently used to characterize an optical fiber from a mechanical viewpoint. One consists in measuring the rupture strength and the other in measuring the factor n which takes account of the imperviousness and hence the lifetime of the fiber.

In this example, the factor n measured ranges from 80 to 95.

EXAMPLE 2
(Test Series No. 2)

In this example, the flow rate, pressure and fiber-drawing conditions have been increased with respect to Example 1:

| | |
|---|---|
| Fiber-drawing speed: | 200 m/min |
| Pressure: | 0.5 to 2 mbar |
| Pressure of Ar in the inlet lock: | 0.25 to 0.75 mbar |
| Flow rate of Ar in the $BBr_3$ bubbling chamber: | 50 to 100 cm$^3$/min |
| Hydrogen flow rate: | 500 to 1000 cm$^3$/min |

The coating layer deposited has a thickness of 300 to 1000 Angstroms depending on the conditions of flow rate and pressure chosen. The speed of deposition is equal to 400 $\mu$m/min and the factor n measured is greater than 100.

EXAMPLE 3
(Test Series No. 3)

This series relates to a deposition of boron and boron nitride, with ammonia gas and hydrogen reacting with boron tribromide. The configuration of the reactor, the temperature of the cooler and the temperature of the substrate are identical to those used in the previous examples.

| | |
|---|---|
| Fiber-drawing speed: | 200 m/min |
| Pressure: | 0.5 to 2 mbar |
| Pressure of Ar in the inlet lock: | 0.25 to 0.75 mbar |
| Flow rate of Ar in the $BBr_3$ bubbling chamber: | 50 to 100 cm$^3$/min |
| Flow rate of hydrogen and ammonia gas: | 500 to 1000 cm$^3$/min |

The thickness of the layer deposited varies from about 100 Angstroms to about 1000 Angstroms depending on the pressure and flow rate conditions chosen. A major proportion of the material deposited consists of boron and boron nitride (about 30% to 40%). The deposition speed is equal to 400 $\mu$m/h and the factor n measured is equal to 100.

The fibers made during these three series of trials show an average mechanical strength as compared to that of a standard fiber and a factor n equal to about 100 or more. The hermetically sealing coatings are deposited in thicknesses of 100 to 1000 Angstroms at speeds of 300 to 500 $\mu$m/min. Furthermore, since any clogging of the walls of the reaction chamber is avoided, the method of the invention enables the making of deposits on very great lengths of optical fibers, in the range of 100 kilometers or more. The initial properties of the fiber are also preserved since it remains capable of being matched and stripped with attenuation values of less than 0.1 dB.

What is claimed is:

1. Method for the deposition of a coating layer on an optical fiber while it is being drawn, said coating layer being designed to improve the imperviousness and lifetime of said optical fiber, the method consisting in decomposing a gas mixture of boron halogenide and hydrogen and/or boron halogenide and ammonia gas by means of a microwave plasma-assisted addition of energy, characterized in that the operation of deposition is performed under a pressure of less than 5 mbar, in the presence of a carrier gas in order firstly to carry said gas mixture to a reaction medium and, secondly, to activate the plasma.

2. Method according to claim 1, characterized in that the boron halogenide is boron tribromide.

3. Method according to claim 1, characterized in that the carrier gas is argon.

4. Method according to claim 1, characterized in that the carrier gas flows at a rate of 10 to 100 cm3/min.

5. Method according to claim 1, characterized in that the optical fiber is heated to a temperature of 400 to 850° C.

6. Method according to claim 1, characterized in that the operation is performed at a fiber-drawing speed of over 20 m/min.

7. Method according to claim 1, characterized in that the flow rate of hydrogen and/or ammonia gas ranges from 200 cm3/min to 1000 cm3/ min.

8. Method according to claim 1, characterized in that the ratio by volume H2/BBr3 is lower than 50.

9. Method according to claim 1, characterized in that the microwave power used to produce the plasma ranges from 500 to 1000 watts.

10. Method according to claim 1, characterized in that the ratio by volume H2/BBr3 ranges from approximately 15 to approximately 40.

11. Device for the implementation of the method according to claim 1, characterized in that it comprises:

a tubular reaction chamber (110) comprising, at each of its ends respectively, an inlet lock (131) and an outlet lock (132) enabling the passage of the fiber (2) into said chamber, a cooling system (120) enabling the wall of the reaction chamber (110) to be maintained at a constant temperature below or equal to 100° C., a pumping set (150) connected firstly to the reaction chamber (120) to trap the residual gases and maintain a constant pressure and, secondly, to the inlet lock (131) and outlet lock (132) to maintain a pressure close to or identical to the pressure prevailing inside the reaction chamber, a gas unit (140) connected to the inlet lock (131) and/or to the reaction chamber (110), means (160, 161, 162, 163) for the production of microwave plasma-assisted heating.

12. Device according to claim 11, characterized in that the reaction chamber (110) is constituted by a tube ma quartz.

13. Device according to claim 11, characterized in that the reaction chamber (110) furthermore comprises a double wall (121) within which there flows a dielectric oil whose temperature is constant so as to maintain the wall of the reaction chamber at a temperature lower than or equal to 100° C.

14. Device according to claim 11, characterized in that the input lock (131) and output lock (132) respectively comprise three and two lines (135).

15. Device according to claim 14, characterized in that the lines (135) have a conical shape.

16. Device according to claim 14, characterized in that the lines are made out of ceramic or out of polymer of a polytetrafluoroethylene or polyamide or polyimide type.

17. Device according to claim 14 characterized in that, when the diameter of the optical fiber is in the range of 125 µm, the diameter of the lines varies linearly from 300 µm to 700 µm.

18. Optical fiber coated with a coating layer designed to increase its imperviousness and its lifetime, characterized in that the coating layer comprises boron and has a thickness of 100 to 1000 Å.

19. Optical fiber with a coating layer designed to increase its imperviousness and its lifetime, characterized in that the coating layer comprises a combination of boron and boron nitride wherein the coating layer has a thickness of 100 to 1000 Å.

* * * * *